United States Patent [19]

Lao et al.

[11] Patent Number: 4,593,243

[45] Date of Patent: Jun. 3, 1986

[54] COPLANAR AND STRIPLINE PROBE CARD APPARATUS

[75] Inventors: Binneg Y. Lao, Rancho Palos Verdes; David A. Rowe, Redondo Beach, both of Calif.

[73] Assignee: Magnavox Government and Industrial Electronics Company, Fort Wayne, Ind.

[21] Appl. No.: 645,429

[22] Filed: Aug. 29, 1984

[51] Int. Cl.$^4$ ........................ G01R 1/06; G01R 31/02
[52] U.S. Cl. .................................. 324/158 P; 333/1; 333/33; 333/34; 333/238; 339/17 C; 324/158 F
[58] Field of Search ................... 333/1, 33, 34, 238, 333/246, 247; 339/17 C, 17 CF; 361/400, 412, 413; 324/158 F, 158 P

[56] References Cited

U.S. PATENT DOCUMENTS

| | | | |
|---|---|---|---|
| 3,518,612 | 6/1970 | Dunman et al. | 333/238 X |
| 3,930,809 | 1/1976 | Evans | 324/158 F X |
| 3,995,239 | 11/1976 | Head et al. | 333/238 X |
| 4,116,523 | 9/1978 | Coberly et al. | 324/158 P X |

OTHER PUBLICATIONS

Bailey et al., *A Neutron Hardness Assurance Based on High-Frequency Probe Measurements*, IEEE Trans. on Nuclear Science, Dec. 1976, pp. 2020-2023.

Rowe et al., *Numerical Analysis of Shielded Coplanar Waveguides*, IEEE Trans. on MTT, Nov. 1983, pp. 911-915.

Van Tuyl et al., *A Manufacturing Process for Analog and Digital Gallium Arsenide Integrated Circuits*, IEEE Trans. on MTT, Jul. 1982, pp. 935-942.

*Introducing the World's First Microwave Wafer Probing Equipment*, Cascade Microwave advertising brochure, 1983.

*Primary Examiner*—Paul Gensler
*Attorney, Agent, or Firm*—Thomas A. Briody; William J. Streeter; Richard T. Seeger

[57] ABSTRACT

Coaxial cables each having a cylindrical electrically conductive outer shield and a central conductive wire insulated from the shield are conductively coupled through a connector to coplanar conductors on a dielectric substrate. The conductors converge toward an opening in the substrate. The coplanar conductors alternately are ground and signal conductors. Each coaxial cable shield is conductively coupled to two ground conductors and the cable wire is conductively coupled to the signal conductor between the two ground conductors. At the substrate opening the ground and signal conductors are conductively coupled to planar stripline waveguide ground and signal blades, respectively. Ground blades between the signal blades are a factor in controlling the signal blade impedance and provide isolation between the signal blades. Each blade is perpendicular to the substrate and has a pitch angle such that the blade extends through the opening below the substrate. A wire or needle probe is conductively coupled to the blade distal end. The needle end is adapted to contact a conductive pad on an IC (integrated circuit) chip. The coplanar conductors and stripline blades are configured to maintain substantially constant characteristic impedance in the signal conductors and their respective blades and to isolate signals in the signal conductors and blades from one another.

28 Claims, 16 Drawing Figures

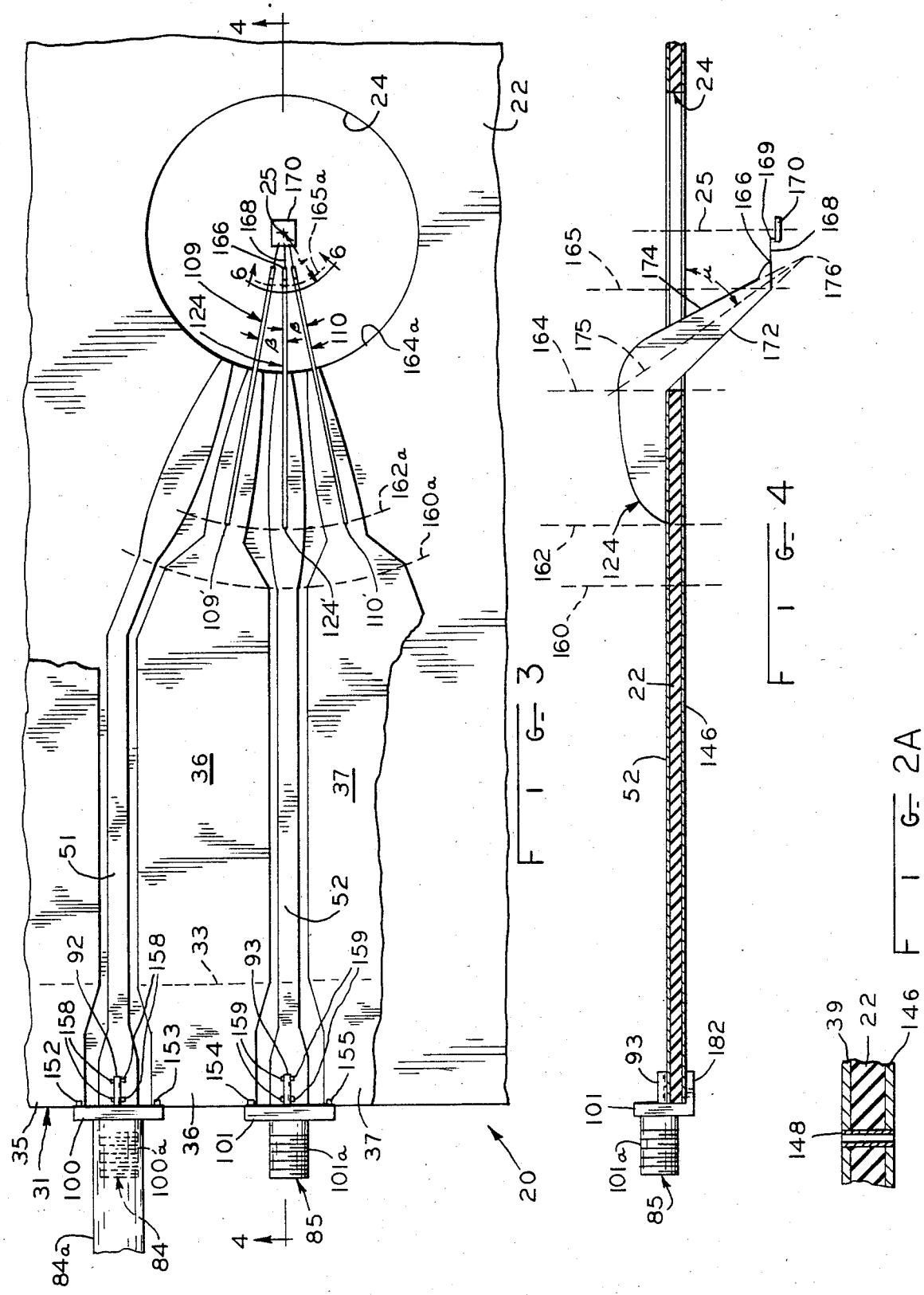

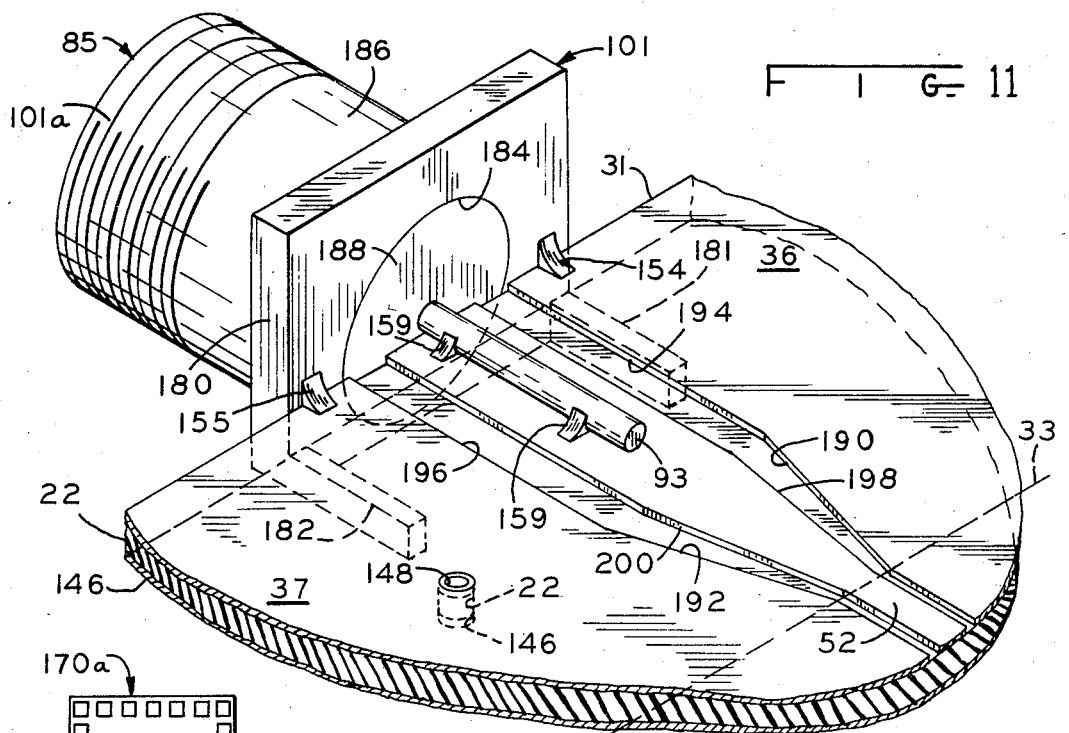
FIG. 11
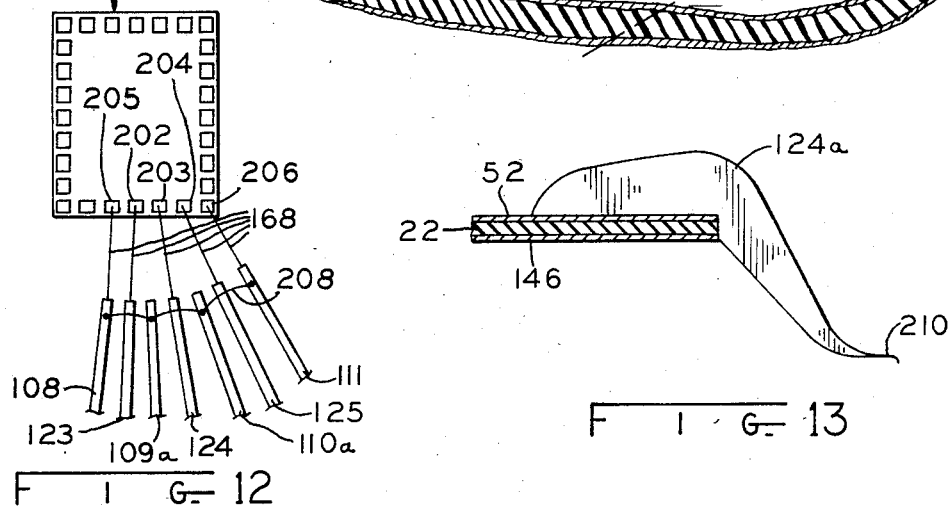
FIG. 12
FIG. 13
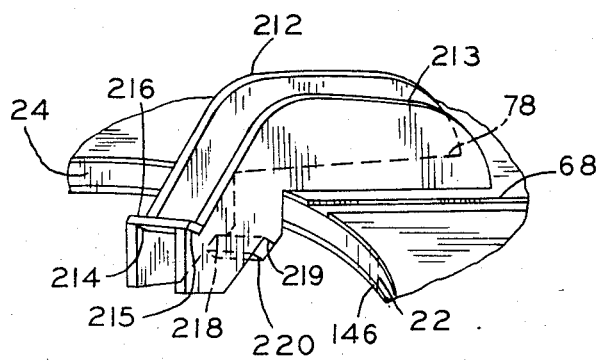
FIG. 14

COPLANAR AND STRIPLINE PROBE CARD APPARATUS

BACKGROUND OF THE INVENTION

1. Field of the Invention

This invention is in the field including ultra high frequency transmission lines and more particularly to transmission lines used on a probe card for electrically conductive connection to contact pads on a relatively small integrated circuit chip.

2. Description of the Prior Art

IC (integrated circuit) chips provide the function of a relatively large number of electrical components in a relatively small size. IC chips are fabricated on thin semiconductor wafers inches in diameter. Hundreds of identical IC chips are made on each wafer. Before sawing the wafer into individual IC chips for packaging, it is desirable to identify any defective IC chips by probing each chip and functionally testing it. This step eliminates the need to package any defective chip and significantly reduces the cost because the major portion of the finished part cost is in the packaging.

Conventional probing for conventional low-frequency chips is done with a probe card which is a PC (printed circuit) board with needle tipped probe blades dispersed radially in a circular hole on the PC board. Metal lines on the board connect the blades electrically to edge connectors which serve as the interface to test equipment.

Because of the uncontrolled characteristic impedance of the needle tipped blade and the metal line structure, such probe cards cease to be useful at signal frequencies above 100 MHz. For high speed circuits, such as GaAs (gallium arsenide) ICs, operating at 1000 MHz and beyond, different kinds of probes must be used.

High frequency probe circuits are available to increase the operating frequencies. In one such circuit a coaxial probe card has a number of miniature coaxial signal lines of a desired characteristic impedance, normally fifty ohms, arranged in a radial configuration. At the end of the line a needle is attached to each of the cable center conductors and to the cable outer shield for contacting the signal and ground pads on the IC chip. This approach entails high assembly cost and is not compatible with the fabrication technology of the conventional probe card.

A second approach is a coplanar IC probe which uses a ceramic substrate like alumina on which tapered coplanar transmission lines of a desired impedance are deposited. Tiny metal balls are placed at the ends of these lines to serve as contacts to the chip. The transmission line is provided almost all the way to the chip, lessening electrical discontinuity and improving high frequency performance to as high as 18 GHz. However, there are several problems associated with this approach. First, the substrate is not as flexible as conventional needles so that lack of planarity either on the IC chip or the probe would create contact problems. Furthermore, the fine line geometry requires the use of a brittle ceramic substrate. As a result, precision fixtures must be used. Secondly, the substrate blocks the view of the IC chip making it difficult for the operator to position the probe accurately on the chip pads. Thirdly the metal ball contacts do not have good wearability when compared to conventional needles. Lastly its manufacture is not compatible with existing card technology, thus implying higher cost.

SUMMARY OF THE INVENTION

Coaxial cables each having a cylindrical conductive outer shield and a cental conductive wire insulated from the shield are electrically conductively coupled through connectors to coplanar conductors on a dielectric substrate. The conductors converge toward an opening, having a central axis, in the substrate. The coplanar conductors alternately are ground and signal conductors. Each coaxial cable shield is conductively coupled to two ground conductors and the cable wire is conductively coupled to a signal conductor between the two ground conductors. At the substrate opening each of the conductors is electrically conductively coupled to a planar stripline blade, the blades converging toward the center of the opening. A wire or needle probe is conductively coupled to each blade distal end. The needle distal end is adapted to contact a conductive pad on an IC chip. The ground blades on either side of a signal blade provide stripline transmission line structure that provides for controlled impedance of the signal blades and isolates signals in the signal blades. The coplanar conductors and stripline blades are configured to maintain substantially constant characteristic impedance of the signal conductors and their respective blades and to isolate signals in the signal conductors from one another. The ground blades are sufficiently large to provide the signal isolation.

The coplanar conductors are laterally dimensioned to maintain a constant characteristic impedance, such as fifty ohms, between the coaxial cables and the blades. The ground conductors are substantially wider than the signal conductors. At the juncture between the coplanar conductors and the blades, the coplanar conductors are provided with a generally rounded narrowing taper. Each blade section that extends through the substrate opening is designed in accordance with known stripline design rules to obtain a desired blade impedance. A ratio G/W can be made a constant, such as two, where G=height of each ground blade and W=height of each signal blade in the blade sections that extend through the substrate opening. The ratio $t/H = [(2r/t) \sin \beta - 1)]^{-1}$ where t=blade thickness; r=radial distance from the opening axis; H=lateral spacing between consecutive ground blades at r; and $\beta$=angle of convergence between adjacent blades. With t/H thus related to r, the only remaining unknown relationship, W/H as a function of r, can be determined according to stripline design rules.

Power conductors and blades may be provided where needed and are similar to and alternate with ground conductors and blades. Bypass chip capacitors are mounted between ground and power blades on shoulders provided in the ground and power blades to improve performance. In certain applications of this invention jumpers may be used between the distal ends of the ground blades in the substrate opening where there is no ground pad on the IC chip for particular ground blades. Also, the blade and needle may be integrated and thus fabricated from a single piece of sheet metal.

It is therefore an object of this invention to provide a relatively low cost substantially constant impedance coplanar and stripline circuitry of relatively high frequency capability for connecting signal lines to an integrated circuit chip for testing the chip prior to packaging.

It is another object of this invention to provide in the circuitry of this invention alternate coplanar elongated ground and signal lines on a dielectric substrate that are laterally dimensioned and spaced to provide a constant characteristic impedance and to provide signal isolation between signal lines.

It is a further object of this invention to provide in the circuitry of the previous objects stripline blades electrically conductively coupled to the coplanar conductors, the ground blades each being between two signal blades and the signal and ground blades being pitched through a substrate opening and having related convergence angles, widths, thicknesses and pitch angles to achieve constant characteristic impedance and signal isolation between signal lines.

The above mentioned and other features and objects of this invention and the manner of obtaining them will become more apparent and the invention itself will be best understood by reference to the following description of an embodiment of the invention taken in conjunction with the accompanying drawings.

BRIEF DESCRIPTION OF THE DRAWINGS

FIG. 2A is an enlarged section taken at 2A—2A of FIG. 2;

FIG. 3 is a fragmented partial schematic plan view of a card circuit similar to that in FIG. 1;

FIG. 4 is a section taken at 4—4 of FIG. 3;

FIG. 11 is a much enlarged perspective view of a cable launcher shown in FIG. 1;

FIG. 12 is a schematic top plan view of a partial circuit having the modification of jumpers connected between ground blades;

FIG. 13 is a schematic side elevational view of a mounted signal blade having the modification of an integrated blade and needle; and FIG. 14 is a perspective view of a partial circuit having the modification of by pass capacitors between a ground blade and a power blade.

DESCRIPTION OF THE PREFERRED EMBODIMENTS

Figure 1:
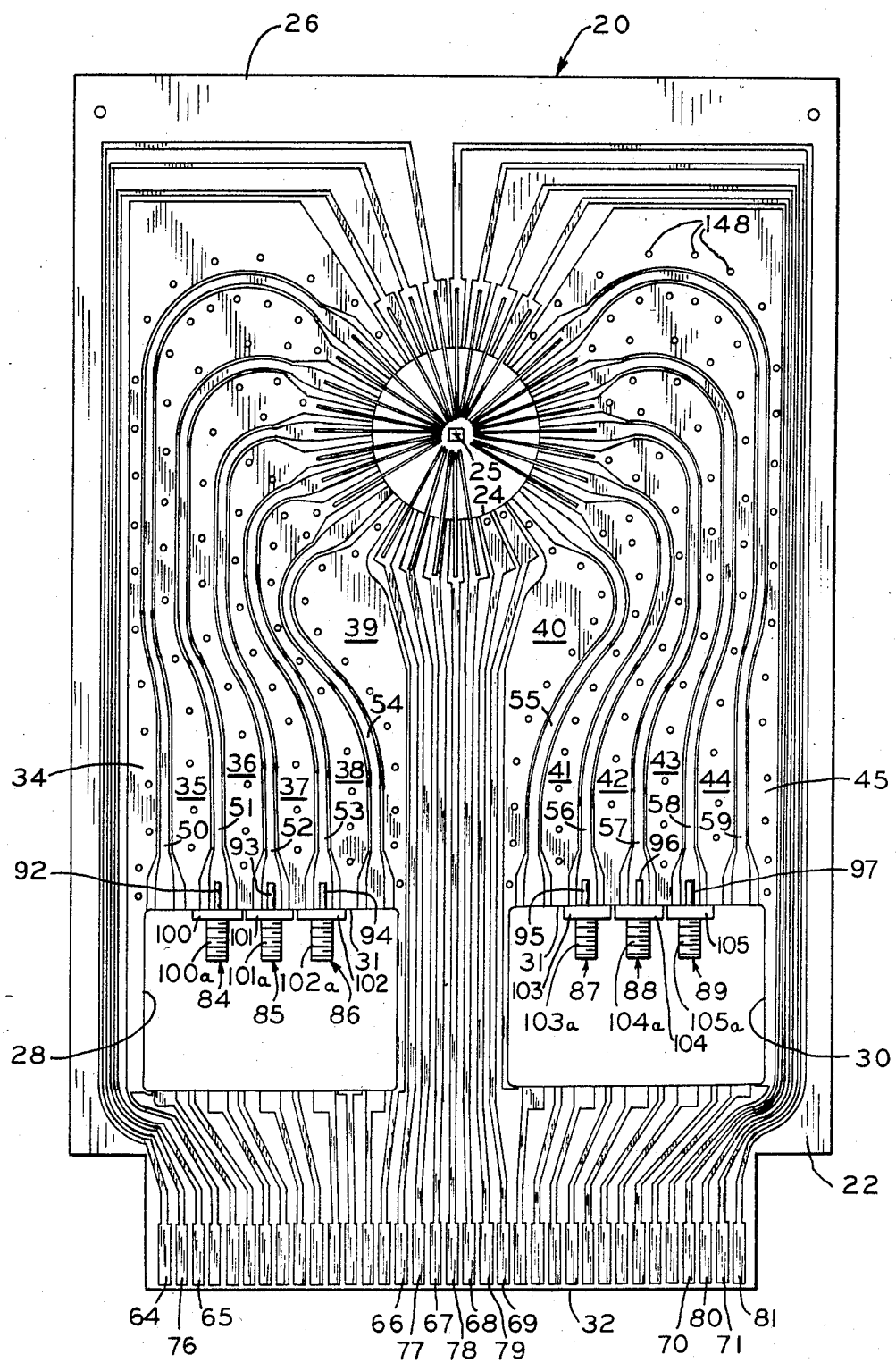
FIG. 1 is a top plan view of a probe card circuit of this invention having ten signal lines and having six coaxial connectors coupled to six of the signal coplanar conductors and eight coplanar ground conductors.
Figure 2:
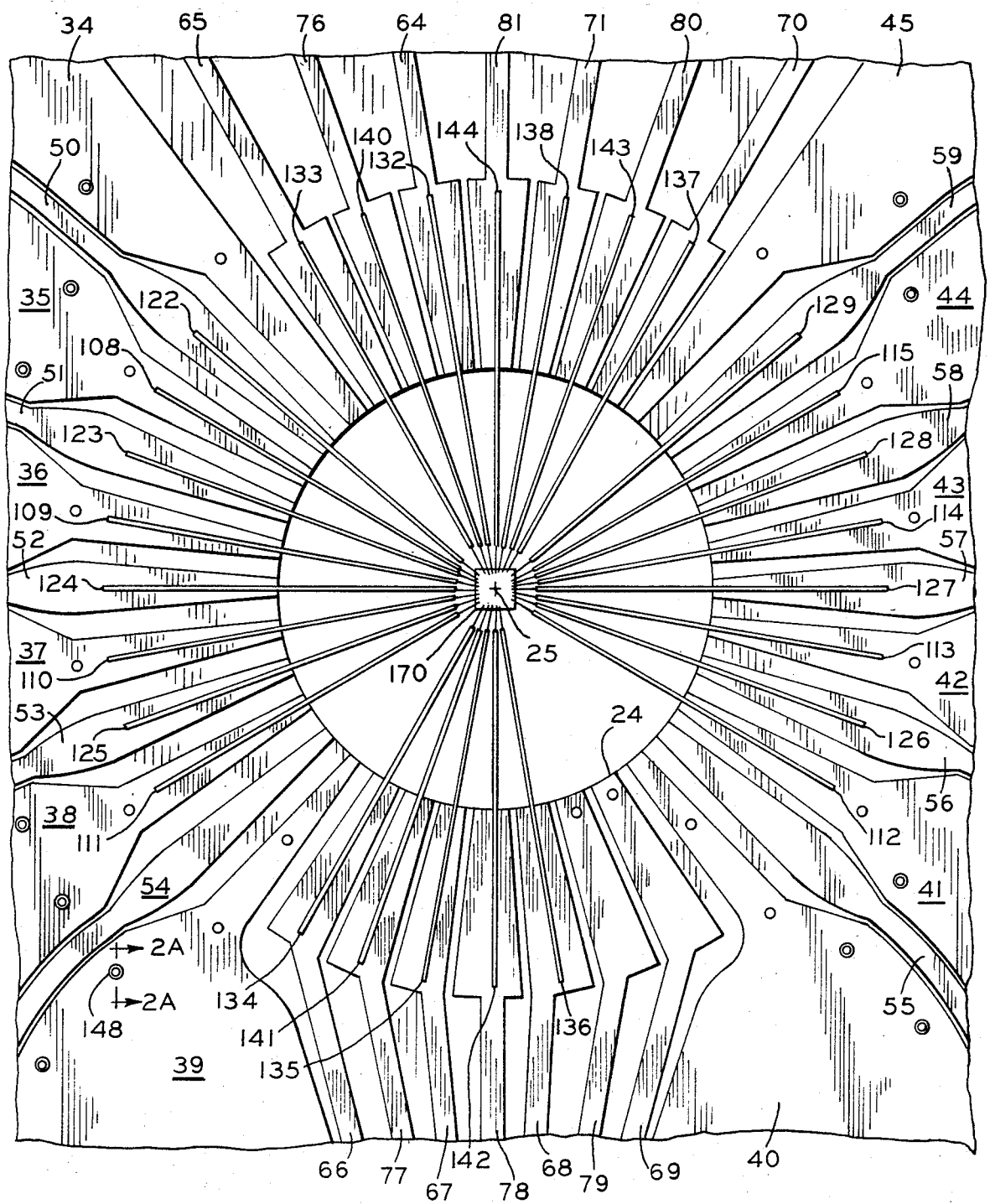
FIG. 2 is an enlarged top plan view of the conductor and blade junction and the blades in the view of FIG. 1.

Referring to FIGS. 1 and 2, an elongated PC probe card 20 has dielectric substrate 22 with circular opening 24, having center axis 25, being adjacent end 26 of card 20. Oblong laterally spaced openings 28, 30 having upper edges 31 are adjacent end 32 of card 20. Card 20 has elongated electrically conductive ground conductors 34-45, elongated conductive signal conductors 50-59, elongated conductive ground, power, or low frequency signal conductors 64-71 and 76-81. All of the conductors converge toward opening 24 and have one of their respective ends flush with opening 24 perimeter. Not all of the conductors are used in the embodiment of FIG. 1 and some of the unused conductors are not referenced.

Threaded miniature coaxial cable connectors 84-89 have central conductive wires 92-97, respectively, square shaped flanges 100-105 and threaded portions 100a-105a. Connectors 84-89 are known in the art as SMA connectors. Other connectors known to the art may be used. Coaxial cables of substantially the same impedance as the connectors can be attached between these connectors and test equipment.

Wires 92-97 are conductively connected to conductors 51-53, 56-58 respectively and flanges 100-105 are conductively connected to conductors 35-38 and 41-44, respectively. Flange 100 is connected to conductors 35, 36; flange 101 is connected to conductors 36, 37; flange 102 is connected to conductors 37, 38; flange 103 is connected to conductors 41, 42; flange 104 is connected to conductors 42, 43; and flange 105 is connected to conductors 43, 44. Each flange 100-105 is connected at diametrically opposite points of its sleeve to its respective conductors as will become more apparent in the discussion of FIG. 11. Thus each shield is connected to two ground conductors and each ground conductor is connected to two shields.

Ground conductors 34-45 alternate with signal conductors 50-59 and are wider in the transverse direction than signal conductors 50-59, the relative widths being designed to achieve substantially constant conductor line impedance according to the design methodology in an article entitled "Numerical Analysis of Shielded Coplanar Waveguides" by D. A. Rowe and B. Y. Lao, inventors herein, and published in IEEE Transactions on Microwave Theory and Techniques, Volume MTT-31, November, 1983 issue, pp 911-915, and is incorporated herein by reference.

Referring more particularly to FIG. 2, ground conductors 35-38 are conductively coupled to planar conductive ground blades 108-111, respectively; ground conductors 41-44 are conductively coupled to planar conductive ground blades 112-115, respectively; signal conductors 50-53 are conductively coupled to planar conductive signal blades 122-125, respectively; signal conductors 56-59 are conductively coupled to conductive planar signal blades 126-129, respectively; ground-/power/low frequency signal conductors 64-68, 70, 71, 76-78, 80, 81 are conductively coupled to ground type blades 132-138, 140-144, respectively. The signal, ground and power blades are in planes substantially perpendicular to the plane of substrate 22 and form a stripline transmission line and are configured and connected to their respective conductors to maintain substantially constant impedance as described below. Each blade has a section that extends through opening 24 and each blade carries a needle probe at its distal end to contact a pad of an IC chip positioned below substrate 22, also as described below. The conductors are formed as by photoetching vapor deposited conductive layers on the upper surface of substrate 22 by techniques known to the art. Thus all areas between the conductors on substrte 22 are dielectric.

Conductive ground layer 146, FIG. 2A and FIG. 4, is formed on, as by lamination techniques known to the art, and coextensive with the bottom surface of substrate 22. Holes are formed in substrate 22 and plated through with a conductive metal to form conductive via through pads 148 between layer 146 and ground conductors 34-45 and break up wave guide cavities and thus increase cavity resonant frequencies well above the signal frequencies in the signal conductors as disclosed in copending application entitled "Microwave Multiport Multilayered Integrated Circuit Chip Carrier", Ser. No. 06/623,990, filed June 25, 1984 by David A. Rowe, Binneg Y. Lao and Robert E. Dietterle, the disclosure of which is incorporated herein by reference. Pads 148 also provide isolation between signal lines. Only several via pads are referenced by numeral 148, it being understood that all non-referenced small circles in FIGS. 1 and 2 are via through pads, and where size permits the plating walls are shown.

In FIG. 3, only connectors 84, 85, ground conductors 35-37, signal conductors 51, 52, ground blades 109, 110 and signal blade 124 associated with card 20 are shown. The mating connector portion 100a and coupled threaded coaxial cable 84a are shown diagrammatically, it being understood each connector 84-89 has such a mating portion coupled to a coaxial cable. The relationships described and shown in FIGS. 3-9 apply to all the corresponding conductors and blades in FIG. 1.

Flange 100 is conductively connected to ground conductors 35, 36 by flange connections 152, 153 respectively. Flange 101 is conductively connected to ground conductors 36, 37 by flange connections 154, 155 respectively. Central connector wires 92, 93 are conductively connected to signal conductors 51, 52 at connections 158, 159 respectively. These connections will be discussed in more detail in connection with the connector launcher of FIG. 11. The lateral dimensions of ground conductors 36, 37 in a first section are substantially greater than the lateral dimension of signal conductor 52. The lateral direction is the vertical direction as viewed in FIG. 3 and the first section of conductors 36, 52, 37 is respectively between first ends of conductors 36, 52, 37 at edge 31 and dashed line 160a. Line 162a is tangent to first ends 109', 124', 110' of blades 109, 124, 110, respectively. Dashed line 164a is at the perimeter of opening 24. The respective second sections of conductors 36, 52, 37 are between line 160a and second ends of conductors 36, 52, 37 at line 164a. Symmetry in this second section is maintained between ground and signal conductors, as it is in the section, later described mroe fully, between edge 31 and line 33. Lines 160a, 162a, 164a, 165a in FIG. 3 are loci of FIG. 4 lines 160, 162, 164, 165 respectively.

Conductors 36, 37 have a first tapered section between line 160a and dashed line 162a that is narrowing and signal conductor 52 has a rounded broadening taper in the section between lines 160a, 162a. Conductors 36, 52, 37 have a generally rounded laterally narrowing taper between lines 162a, 164a. The first sections of blades 109, 124, 110 between lines 162a, 164a overlap and are conductively connected to conductors 36, 52, 37, respectively. The configuration and spacing of conductors 36, 52, 37 are designed according to the design methodology in the aforementioned Rowe and Lao article to provide substantially constant impedance between connectors 84, 85 and opening 24.

Referring particularly to FIG. 4, dashed line 165 is adjacent distal foot 166 of blade 124. Blade 124 has a first section between lines 162, 164 and a second section between lines 164, 165. Resilient conductive probe needle 168 is conductively coupled to blade foot 166 and resilient pressure is applied to distal end 169 of needle 168 to provide a conductive contact between end 169 and a pad on IC chip 170. Chip 170 has alternating ground and signal pads. Each blade distal foot is likewise conductively coupled to a resilient conductive probe needle which has a resilient pressure contact with a corresponding pad on chip 170. The length of needle 168 is preferably kept to a minimum, e.g. 50 mils, so that the effect of any mismatch of needle impedance, which may be somewhat larger than blade impedance, is not large. Correct length of the needles places the distal ends of the blades at a proper spacing from one another so that the added capacitance, and resulting lower impedance, of closely spaced blades will compensate almost exactly for the increased impedance of the needle. By using the correct ratio of needle 168 diameter to lateral spacing between adjacent needles it is possible to achieve a desired needle impedance that matches blade impedance. The problem with this approach is that the needle spacing becomes quite small at the chip. By tapering the blade and keeping needle length small, the discontinuity effect is minimized. Probes for contacting the chip pads may be other than needles, the blades may have different probes, and all ground blades need not have a probe. It is desirable, however, that all probes apply substantially equal pressure to the pads for reliability of electrical connections. All conductive signal, ground, and power conductors and blades are of a conductive material such as copper.

In the transition region between coplanar transmission line and stripline transmission line, which is the first section of signal blade 124 between lines 162, 164, the coplanar signal conductor 52 and signal blade 124 are shaped empirically to obtain the configuration shown in FIGS. 3 and 4 to achieve a predetermined line impedance, fifty ohms in the embodiment disclosed. The starting point is to shape conductor 52 according to the design methodology of the aforementioned Rowe and Lao article.

Blade 124 has tapered edges 172, 174 in its second section which is pitched through opening 24 and extends below substrate 22. The angle of pitch between bisector 175 of the angle between edges 172, 174, which angle has apex 176, and the plane of substrate 22 is $\mu$. Angle $\mu$ is determined by the size of hole 24, which may be for example 1-1½ inches, and how far foot 166 extends below substrate 22, which may be for example ½-¾ inches. If hole 24 is too large, then the blades lose their structural rigidity and if too small, the number of blades usable becomes too limited. Thus the second section of blade 124 between lines 164, 165 extends through opening 24 and foot 166 is vertically spaced below substrate 22. Blades 109, 124, 110 have an equiangular arcuate spacing about the periphery of opening 24, the angle $\beta$ being between adjacent blades and being a function of the number of blades in a given arc. All blades are separated from an adjacent blade by an angle $\beta$. For example, where all 360° of the perimeter of opening 24 is used and the total number of blades is 32, $\beta = 360°/32 = 11.25°$.

Figure 5:
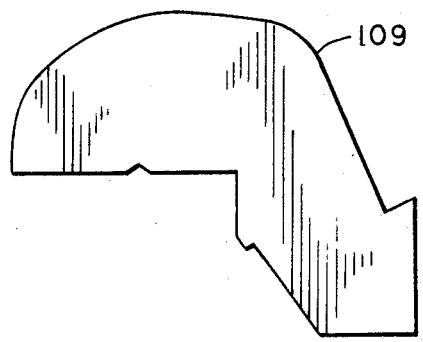
FIG. 5 is an enlarged side elevational view of a blade used as a ground blade and power blade.

Referring to FIG. 5, blade 109 is shown. Each ground blade 108-115, 132-138 and each power blade 140-144 may have the configuration of blade 109. The shape of blade 109 is made sufficiently large and proportioned to provide isolation between the signal blades on either side of a ground blade but otherwise may take a variety of configurations.

Figure 6:
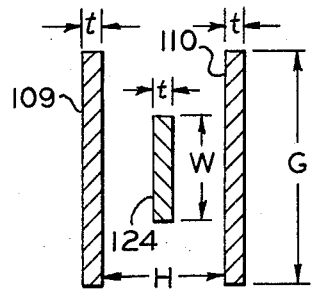
FIG. 6 is an enlarged section taken at 6—6 of FIG. 3.
Figure 5A:
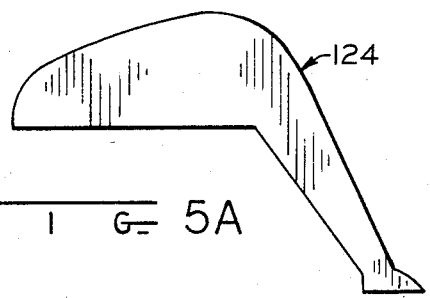
FIG. 5A is a view similar to FIG. 5 of a signal blade.
Figure 7:
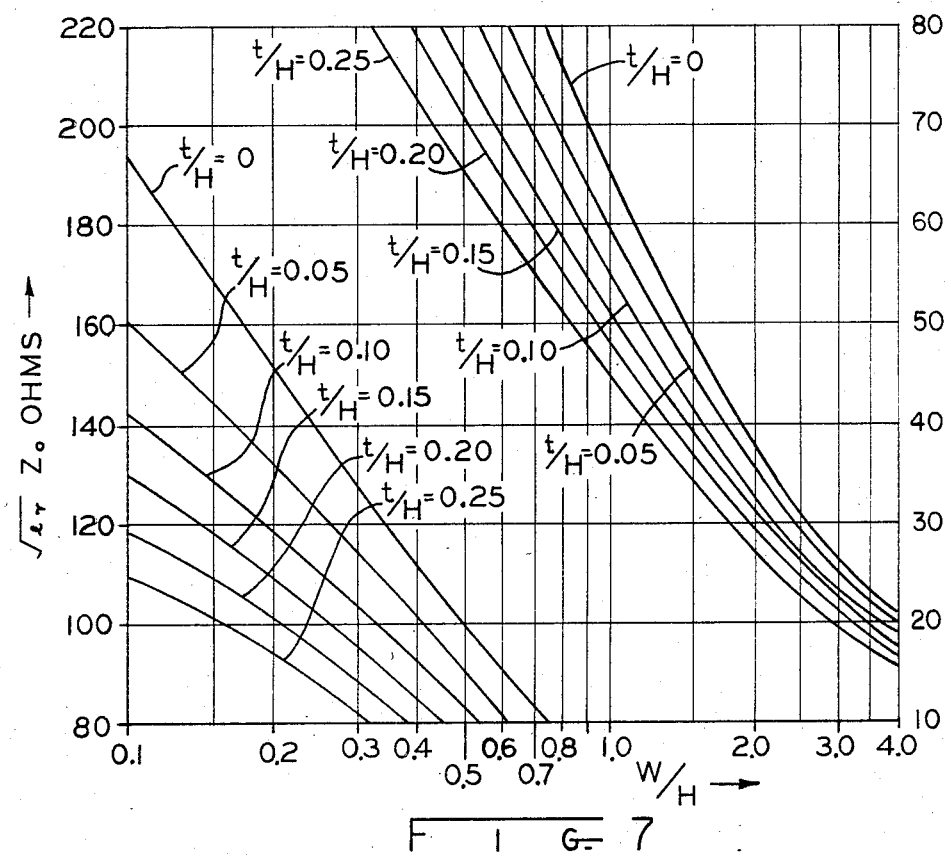
FIG. 7 is a prior art graph of a series of plotted curves with stripline impedance scaled on the y axis and the ratio W/H scaled on the x axis.

Referring to FIG. 6, G=height of each of ground blades 109, 110; W=height of signal blade 124; H=lateral separation between the ground blades 109, 110; and t=thickness of each of the blades 109, 124, 110. FIG. 7 is a prior art stripline impedance plot of $\sqrt{e_r}Z_o$, scaled in ohms along the y axis against the ratio W/H, scaled along the x axis for various values of the ratio t/H, where $e_r$=dielectric constant of the medium between the blades and $Z_o$=the blade desired characteristic impedance. The plots in FIG. 7 are segmented; in other words, the t/H curves in the lower left of FIG. 7 are extensions of the t/H curves in the upper right of FIG. 7. The y axis scale on the left margin of FIG. 7 pertains to the lower left curves and the y axis scale on the right margin of FIG. 7 pertains to the upper right curves.

Figure 8:
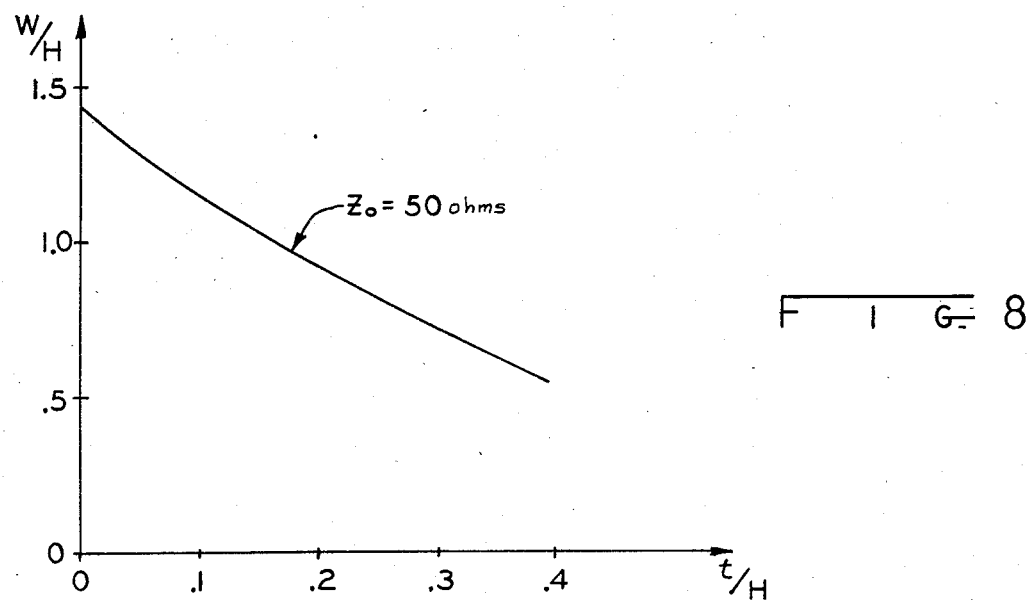
FIG. 8 is a graph of a plotted curve having the ratio W/H scaled on the y axis and the ratio t/H scaled on the x axis.

For a given transmission line impedance the ratio W/H is plotted against the ratio t/H and a plot of these ratios for an impedance of $Z_o$=50 ohms as determined from FIG. 7 is shown in FIG. 8 where W/H is scaled on the y axis and t/H is scaled on the x axis. The curve of FIG. 8 is for a $Z_o$=50 ohms, other values of $Z_o$ having curves determined as for the curve of FIG. 8. If R=radial distance distance of section 6—6 from axis 25 and $\beta$=angle between adjacent blades as before, then the following relationship exists: $t/H = [(2r/t) \sin \beta - 1]^{-1}$. This t/H vs. r/t equation holds true for every radial distance r of blade 124 second section between lines 164, 165 and is used to determine the plot of the curve in FIG. 9.

Figure 9:
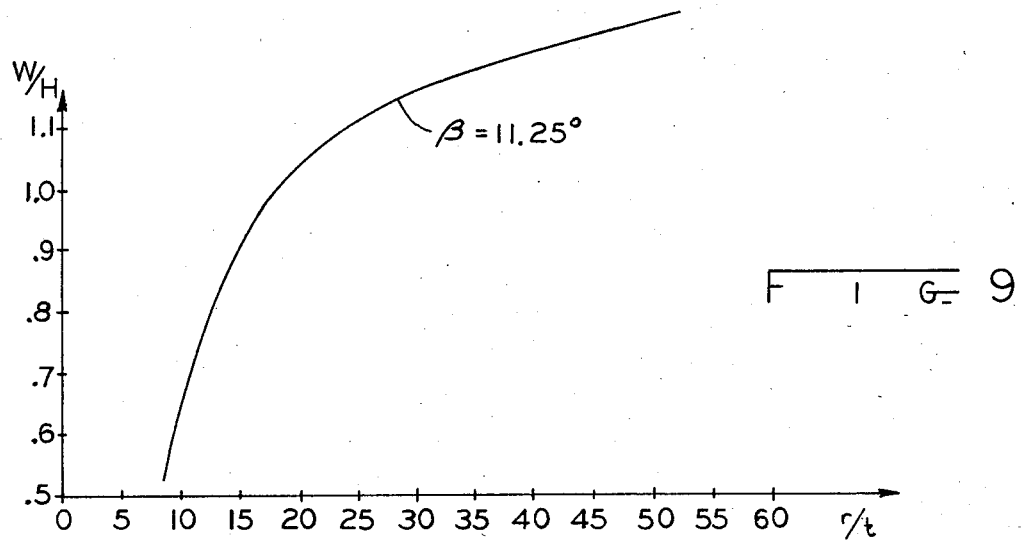
FIG. 9 is a graph of a plotted curve with the ratio W/H scaled on the y axis and the ratio r/t scaled on the x axis.
Figure 10:
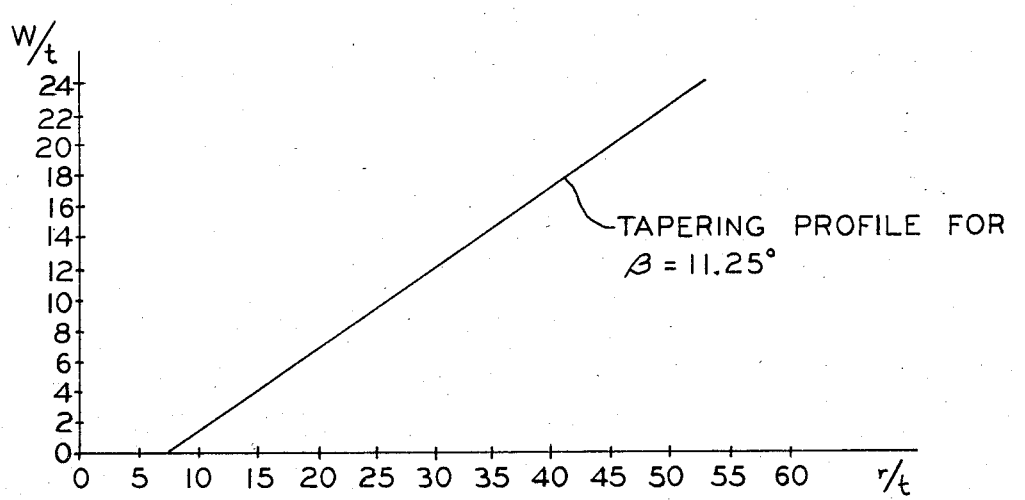
FIG. 10 is a graph of a plotted curve having the ratio W/t scaled on the y axis and the ratio r/t scaled on the x axis.

Referring to FIG. 9 a plot of ratio W/H, scaled along the y axis, against r/t, scaled along the x axis, for an angle $\beta$=11.25° is shown. FIG. 10 is a plot of the ratio of W/t scaled along the y axis against r/t scaled along the x axis for a $\beta$=11.25°. FIG. 10 is derived from FIG. 9 using the t/H vs. r/t equation above.

In designing a signal blade for a desired $Z_o$ and a given angle $\beta$ and thickness t, the graph of FIG. 10 is used to determine W at each distance r from axis 25. As mentioned, hole 24 size is controlled for structural rigidity of the blades. A ratio G/W at each distance r is chosen to provide the above mentioned isolation of signals between the signal blades and in this example is about two. H is determined by the angle $\beta$ and radial distance r. Blade 124 is centered both vertically and horizontally between blades 109, 110. Each signal blade in a given probe card is similar to every other signal blade and each ground blade is similar to every other ground blade, although as mentioned a ground blade configuration may be varied providing it is large enough in area to isolate signals in the signal blades from one another. Thus each signal line is comprised of a signal conductor and respective signal blade and has a well defined capacitance to ground to obtain a desired constant characteristic impedance. The presence of ground blades adjacent the IC chip makes possible short ground connections to the chip minimizing undesired inductance.

Referring to the connector launcher of FIG. 11, connector 85 has conductive threaded sleeve 186 and flange 101 which has vertical wall 180 and horizontally extending legs 181, 182 extending from the lower corners of wall 180. Wall 180 has circular opening 184. Center conductor 93 is insulated from wall 180 by elongated annular dielectric 188 in opening 184. Legs 181, 182 are conductively bonded on their upper surfaces to ground layer 146. The vertical distance between conductor 93 and each of legs 181, 182 is approximately 60 mils, the thickness of substrate 22 and its conductive layers.

Ground conductors 36, 37 have chamfers 190, 192 respectively which flare out from line 33 towards edge 31 and provide a separation distance between facing edges 194, 196 of conductors 36, 37 respectively that is equal to the outer diameter of dielectric sleeve 188 to provide minimum impedance discontinuity. Conductors 36, 37 are conductively bonded to wall 180 as by solder joints 154, 155 respectively. Conductor 52 has flare out chamfers 198, 200 in the longitudinal area of chamfers 190, 192 that widen conductor 52 lateral dimension in the longitudinal area of wire 93. The flaring out of conductor 52 is designed according to the methodology in the aforementioned Rowe et al. article. The lateral dimension or width of each signal conductor to the left of line 33 is made narrow to minimize cross talk between signal conductors. Conductor 52 is conductively bonded as by solder joints 159 to wire 93. Via through pad 148 is plated in a through hole in substrate 22 and conductively connects conductor 37 to ground layer 146. Each of the connectors is conductively connected to their respective ground and signal conductors in a corresponding manner.

Referring to FIG. 12, chip 170a has signal pads 202-204 between ground pads 205, 206. Signal pads 202-204 do not alternate with ground pads 205, 206 on chip 170a as they do on chip 170. Ground blades 108, 111 each are provided with a probe needle 168 which is conductively connected to its respective ground blade as described for needle 168 to blade 124. Conductive jumper 208 is conductively connected to each of ground blades 108, 109a, 110a, 111. Signal blades 123-125 each have a probe needle 168 conductively connected as described for needle 168 to blade 124. Thus the advantages of providing ground conductors and ground blades between signal conductors and signal blades, respectively, is obtained even though there are no ground pads on the IC chip for all of the ground blades. Other jumper arrangements may be made for the ground blade to accommodate various IC chip pad arrangements. In FIGS. 12-14 components having reference numerals previously used are similar to the components previously referenced by those numerals. Components having the suffix "a" after a previously used reference numeral are similar to the previous component but altered in the manner described for each component.

Referring to FIG. 13, an embodiment of this invention is shown where blade 124a and integrated needle end 210 are fabricated from the same piece of sheet metal. This embodiment minimizes discontinuities of the separate blade and needle and adds capacitance to the blade-needle interface.

Referring to FIG. 14, an embodiment is shown that has improved signal and noise bypass from a power blade to a ground blade. Power blade 212 and ground blade 213 have shoulders 214, 215 respectively on their respective upper edges to which is conductively bonded bypass capacitor 216. Blades 212, 213 also have shoulders 218, 219 respectively on their respective lower edges to which is bonded bypass capacitor 220.

It is also possible to make the coplanar conductors microstrip conductors, i.e. to eliminate ground conductors, e.g. conductors 34–45, but this would adversely affect the isolation of signals in the signal conductors.

While there have been described above the principles of this invention in connection with specific embodiments, it is to be understood that this is by way of example and is not limiting of the scope of this invention.

What is claimed is:

1. Apparatus comprising:

a planar dielectric substrate having an opening with a central axis;

a plurality of coplanar flat elongated conductors each having joined first and second longitudinal sections and having first and second ends;

at least one coaxial connector comprising an outer cylindrical conductive elongated shield adapted to be grounded and a conductive wire adapted for connection to a signal source; said wire being electrically insulated from said shield and supported centrally of said shield;

first means for coplanar mounting to one side of said substrate of at least first, second and third of said coplanar conductors; said first and third conductors being ground conductors and said second conductor being a signal conductor; said conductors each having said second end substantially flush with the perimeter of said opening and each of said conductors being longitudinally oriented from the perimeter of said opening outwardly to the edges of said substrate; said second conductor being between said first and third conductors and being laterally spaced and electrically insulated from said first and third conductors along the entire length of said second conductor;

second means for conductively connecting one end of said shield to said first end of each of said first and third conductors;

third means for conductively connecting one end of said wire to said first end of said second conductor;

at least first, second and third flat planar conductive blades each having a thickness t; said first and third blades being ground blades and said second blade being a signal blade;

fourth means for conductively connecting a blade first section of said first, second and third blades to an overlapped longitudinal second section of said first, second and third conductors respectively to provide a transition section having a predetermined defined impedance and being between each of said coplanar conductors and its respective said blade; the plane of each of said blades being substantially perpendicular to the plane of said substrate;

each of said blades having a blade second section having an angular pitch to its respective blade first section and extending through said opening a predetermined length towards said axis; the pitch of said blade second section of each of said blades being at an angle $\mu$ to the plane of said substrate;

at least first, second and third resilient, conductive, probe needles each having first and second ends;

fifth means for conductively connecting said first end of said first, second and third needles to said second section of said first, second and third blades respectively; said second end of each of said needles being adjacently spaced from said axis and spaced from the plane of said substrate; said second end of each of said needles adapted to conductively contact a conductive pad on an integrated circuit chip positioned within the confines of said opening and spaced along said axis from the plane of said substrate;

said opening being generally circular in configuration and said first, second and third blades being arcuately spaced from one another about the perimeter of said opening by an angle $\beta$; said second blade being between said first and third blades to provide a stripline transmission line;

said first and third blades each having a distance G between opposite longitudinal edges in said first and third blade second sections and said second blade having a distance W between opposite longitudinal edges in said second blade second section; each of said distances G and W varying along the length of said blades in said blade second section and the ratio G/W being equal to a first constant in said blade second sections at each radial distance r from said axis;

said first and third blades being laterally separated by a distance H, said distance H varying along the length of said blades in said first and third blade second sections;

the ratio W/H at each radial distance r from said center axis in said blade second sections being equal to a first ratio corresponding to each r;

the ratio t/H at each radial distance r from said center axis in said first and third blade second sections being equal to a second ratio corresponding to each r;

said constant and said first and second ratios being selected to provide a substantially constant predetermined characteristic impedance along each of said blades in said blade second sections.

2. The apparatus of claim 1 wherein each blade second section is tapered in the blade plane.

3. The apparatus of claim 1 wherein said second ratio t/H is equal to $[(2r/t) \sin \beta - 1]^{-1}$ and said first ratio W/H varies proportionally to said second ratio t/H.

4. The apparatus of claim 1 wherein said substrate has a ground layer of conductive material formed on and substantially coextensive with the side of said substrate opposite to said one side; said outer shield being conductively connected to said ground layer.

5. The apparatus of claim 1 wherein said second means conductively connects a first point on said one end of said shield to said first conductor and a substantially diametrically opposite point on said one end of said shield to said third conductor.

6. The apparatus of claim 5 including a plurality of said coaxial connectors;

said plurality of conductors including first alternate conductors each being conductively connected at its respective first end to a respective signal wire of said connectors; said first alternate conductors each being similar to said second conductor;

said plurality of conductors including second alternate conductors; a second alternate conductor being laterally between successive first alternate conductors so that a first alternate conductor and a second alternate conductor are in alternating position on said substrate; said second alternate conductors being similar to said first conductor; said first end of each of said second alternate conductors being conductively connected to a said shield; two of said second alternate conductors being conductively connected to diametrically opposite points respectively on each said shield of each of successive adjacent of said coaxial connectors so that said conductors are alternately ground and signal conductors about the perimeter of said opening and said blades are alternately ground blades and signal blades; each ground conductor being shared by the signal conductor on either side thereof and each ground blade being shared by the signal blade on either side thereof thereby providing a relatively high density of signal blades on the perimeter of said opening;

said first and second alternate conductors having their respective second ends equally arcuately spaced by an angle $\beta$ about at least a portion of the perimeter of said opening.

7. The apparatus of claim 6 wherein said portion is a major portion of the perimeter of said opening.

8. Apparatus for conducting signals from at least one signal line comprising:

a planar dielectric substrate;

a plurality of coplanar flat elongated conductors each having first and second joined longitudinal sections and said conductors each having first and second ends; each said conductor first end being at a first edge of said substrate and each said conductor second end being at a second edge of said substrate;

first means for coplanar mounting to one side of said substrate of at least first, second and third of said coplanar conductors; said second conductor being a signal conductor and being between said first and third conductors and being laterally spaced and electrically insulated from said first and third conductors along the entire length of said second conductor;

second means for conductively connecting said first end of each of said first and third conductors to an electrical ground whereby each of said first and third conductors are ground conductors;

third means for conductively connecting said first end of said second conductor to a signal line whereby said second conductor is a signal conductor;

a plurality of elongated planar conductive blades each having joined first and second longitudinal sections and each of said blades having first and second ends;

fourth means for conductively connecting said first section of each of said plurality of blades in overlapping relation to a longitudinal second section of each of said first, second and third conductors, respectively, to provide each conductor with a connected respective blade in a transition section having a predetermined defined impedance; the plane of each of said plurality of blades being substantially perpendicular to the plane of said substrate for providing said blades in stripline configuration; said blade second sections each having an angular pitch relative said substrate.

9. The apparatus of claim 8 wherein said second conductor has a substantially constant characteristic impedance along substantially its entire length.

10. The apparatus of claim 8 including a conductive jumper wire being conductively bonded to and between each of said blades connected to said first and third conductors.

11. The apparatus of claim 8 wherein said plurality of conductors includes first alternate conductors; said first alternate conductors each being similar to said second conductor;

said plurality of conductors including second alternate conductors; a second alternate conductor being laterally between successive first alternate conductors so that a first alternate conductor and a second alternate conductor are in alternating position on said substrate; said second alternate conductors being similar to said first conductor; so that said conductors are alternately ground and signal conductors at said second edge of said substrate and said blades are alternately ground blades and signal blades; each ground conductor being shared by the signal conductor on either side thereof and each ground blade being shared by the signal blades on either side thereof thereby providing a relatively high density of signal blades at said second edge of said substrate.

12. The apparatus of claim 8 including a plurality of resilient needle probes adapted to resiliently and conductively contact a corresponding chip conductive pad on an integrated circuit positioned beneath said substrate; a said probe being conductively bonded to a second end of each of said blades.

13. The apparatus of claim 12 wherein said needle probes are integral with the second end of each of said blades.

14. The apparatus of claim 8 wherein said first section of said second conductor has a substantially constant lateral dimension; said first section of said first and third conductors having a substantially wider lateral dimension than the lateral dimension of said first section of said second conductor;

said second section of each of said first and third conductors having a lateral narrowing first taper from its respective first section lateral dimension;

said second section of said second conductor having a lateral broadening first taper from its first section lateral dimension;

said second section of each of said first, second and third conductors having a generally rounded laterally narrowing second taper from its respective first taper to its respective conductor second end.

15. The apparatus of claim 14 wherein said said planar dielectric substrate has an opening with a central axis; said substrate second edge being at the perimeter of said opening;

said first means for mounting said at least first, second and third of said coplanar conductors so that each has its said second end substantially flush with the perimeter of said opening and each of said conductors is longitudinally oriented from the perimeter of said opening outwardly to a corresponding edge of said substrate;

said plurality of planar conductive blades each having a thickness t;

said second section of each of said blades having an angular pitch relative to said substrate and extending through said opening a predetermined length towards said opening axis; the pitch of said blade second section of each of said blades being at an angle $\mu$ to the plane of said substrate;

said opening being generally circular in configuration and each of said blades being arcuately spaced from one another about the perimeter of said opening by an angle $\beta$; said blade connected to said second conductor being a signal blade and being between said blades connected to said first and third conductors, respectively;

said blades connected to said first and third conductors each having a distance G between opposite longitudinal edges in its respective second section and said blade connected to said second conductor having a distance W between opposite longitudinal edges in its second section; each of said distances G and W varying along the length of said blades in said blade second sections;

a constant ratio G/W being in said blade second sections at each radial distance r from said axis;

said second sections of said blades connected to said first and third conductors being laterally separated by a distance H, said distance H varying along the length of said second sections of said blades connected to said first and third conductors;

a first ratio W/H at each radial distance r from said opening axis in said blade second sections varying in correspondence to t/H;

a second ratio t/H at each radial distance r from said opening axis in said blade second sections varying in correspondence to each r;

said constant and said first and second ratios being selected to provide a substantially constant predetermined characteristic impedance along each of said blades in said blade first sections.

16. The apparatus of claim 15 wherein each blade second section first taper has a tapering angle in the plane of the blade.

17. The apparatus of claim 15 wherein said second ratio t/H is equal to $[(2r/t) \sin \beta - 1]^{-1}$.

18. The apparatus of claim 15 wherein said substrate has a ground layer of conductive material formed on and substantially coextensive with the side of said substrate opposite to said one side; said outer shield being conductively connected to said ground layer.

19. The apparatus of claim 15 wherein a third ratio W/r is a constant.

20. The apparatus of claim 15 including at least one coaxial connector comprising an outer cylindrical conductive elongated shield adapted to be grounded and a conductive wire adapted for connection to a signal source; said wire being electrically insulated from said shield and supported centrally of said shield;

said second means for conductively connecting said shield to said first end of each of said first and third conductors;

said third means for conductively connecting one end of said wire to said first end of said second conductor.

21. The apparatus of claim 20 wherein said plurality of coplanar conductive elongated conductors includes conductors having their respective second ends equally arcuately spaced about at least a portion of the perimeter of said opening;

a plurality of said coaxial connectors; said plurality of conductors including first alternate conductors each being conductively connected at its respective first end to a respective signal wire of said connectors; said first alternate conductors each being similar to said second conductor;

said plurality of conductors including second alternate conductors; a second alternate conductor being laterally between successive first alternate conductors so that a first alternate conductor and a second alternate conductor are in alternating position on said substrate; said second alternate conductors being similar to said first conductor; said first end of each of said second alternate conductors being conductively connected to a shield of said connectors so that each said second alternate conductor is conductively connected to a shield of two successive adjacent of said coaxial connectors so that said conductors are alternately ground and signal conductors about the perimeter of said opening and said blades are alternately ground blades and signal blades; each ground conductor being shared by the signal conductor on either side thereof and each ground blade being shared by the signal blade on either side thereof thereby providing a relatively high density of signal blades on the perimeter of said opening.

22. The apparatus of claim 21 wherein said portion is a major portion of the perimeter of said opening.

23. The apparatus of claim 20 wherein said wire extends a longitudinal first distance from said shield; said first and third conductors at said first ends thereof being laterally spaced from opposite edges of said second conductor by a first spacing; said first spacing on either side of said second conductor being substantially constant for approximately said first distance from said first ends of said first and third conductors; each of said first spacings on either side of said second conductor being tapered to a second spacing on either side of said second conductor that is smaller than said first spacing to provide a transition zone from said coaxial connector of substantially constant impedance and controlled impedance discontinuity.

24. The apparatus of claim 23 wherein the lateral spacing between opposite facing edges of said first and third conductors at said coaxial connector is approximately equal to the inner diameter of said shield to provide controlled impedance discontinuity.

25. Apparatus for conducting signals from a signal line comprising:

a planar dielectric substrate;

a plurality of coplanar flat elongated conductors each having first and second joined longitudinal sections and said conductors each having first and second ends; each said conductor first end being at a first edge of said substrate and each said conductor second end being at a second edge of said substrate;

first means for coplanar mounting to one side of said substrate of at least first and second of said coplanar conductors; said second conductor being a power conductor and being adjacent said first conductor and being laterally spaced and electrically insulated from said first conductor along the entire length of said second conductor;

second means for conductively connecting said first end of said first conductor to an electrical ground;

third means for conductively connecting said first end of said second conductor to a power line;

a plurality of elongated planar conductive blades each having joined first and second longitudinal sections and each of said blades having first and second ends;

fourth means for conductively connecting said first section of one of said plurality of blades to a longitudinal second section of each of said first and second conductors; the plane of each of said plurality of blades being substantially perpendicular to the plane of said substrate; said blade second sections each having an angular pitch relative said substrate;

a first edge of said second section of each said first and second blades having a first shoulder formed thereon;

a first bypass capacitor being conductively bonded to each of said shoulders to provide noise and signal bypass in said second blade to said first blade.

26. The apparatus of claim 25 wherein a second edge of said second section of each said first and second blades has a second shoulder formed thereon;

a second bypass capacitor being conductively bonded to each of said second shoulders to provide noise and signal bypass in said second blade to said first blade.

27. In a probe card for coupling signals to an IC chip placed beneath the card and having a planar dielectric substrate; a plurality of coplanar flat elongated conductors each having first and second joined longitudinal sections and said conductors each having first and second ends; each said conductor first end being at a first edge of said substrate and each said conductor second end being at a second edge of said substrate; at least first, second and third of said coplanar conductors being coplanar mounted to one side of said substrate; said second conductor being a signal conductor and being between said first and third conductors and being laterally spaced and electrically insulated from said first and third conductors along the entire length of said second conductor; said first end of each of said first and third conductors conductively connected to an electrical ground; the improvement comprising:

first means for conductively connecting said first end of said second conductor to a signal line;

a plurality of elongated planar conductive blades each having joined first and second longitudinal sections and each of said blades having first and second ends;

second means for conductively connecting said first section of each of said plurality of blades to a longitudinal second section of each of said first, second and third conductors, respectively; the plane of each of said plurality of blades being substantially perpendicular to the plane of said substrate; said blade second sections each having an angular pitch relative said substrate.

28. Apparatus comprising:

a planar dielectric substrate having an opening with a central axis;

a plurality of coplanar flat elongated conductors each having joined first and second longitudinal sections and having first and second ends;

at least one coaxial member comprising an outer cylindrical conductive elongated shield adapted to be grounded and a conductive wire adapted for connection to a signal source; said wire being electrically insulated from said shield and supported centrally of said shield;

first means for coplanar mounting to one side of said substrate of at least first, second and third of said coplanar conductors; said first and third conductors being ground conductors and said second conductor being a signal conductor; said conductors each having said second end substantially flush with the perimeter of said opening and each of said conductors being longitudinally oriented from the perimeter of said opening outwardly to the edges of said substrate; said second conductor being between said first and third conductors and being laterally spaced and electrically insulated from said first and third conductors along the entire length of said second conductor;

second means for conductively connecting one end of said shield to said first end of each of said first and third conductors;

third means for conductively connecting one end of said wire to said first end of said second conductor;

at least first, second and third planar conductive blades; said first and third blades being ground blades and said second blade being a signal blade;

fourth means for conductively connecting a blade first section of said first, second and third blades to an overlapped longitudinal second section of said first, second and third conductors respectively to provide a transition section having a predetermined defined impedance and being between each of said coplanar conductors and its respective said blade; the plane of each of said blades being substantially perpendicular to the plane of said substrate;

each of said blades having a blade second section having an angular pitch to its respective blade first section and extending through said opening a predetermined length towards said axis; the pitch of said blade second section of each of said blades being at an angle to the plane of said substrate;

said opening being generally circular in configuration and said first, second and third blades being arcuately spaced from one another about the perimeter of said opening; said second blade being between said first and third blades to provide a stripline transmission line.

* * * * *